(12) United States Patent
Chang (10) Patent No.: US 9,716,073 B2
(45) Date of Patent: Jul. 25, 2017

(54) MACHINE FOR TRANSFERRING MICRO-DEVICE

(71) Applicant: MIKRO MESA TECHNOLOGY CO., LTD., Apia (WS)

(72) Inventor: Pei-Yu Chang, Tainan (TW)

(73) Assignee: MIKRO MESA TECHNOLOGY CO., LTD., Apia (WS)

( * ) Notice: Subject to any disclaimer, the term of this patent is extended or adjusted under 35 U.S.C. 154(b) by 288 days.

(21) Appl. No.: 14/547,153

(22) Filed: Nov. 19, 2014

(65) Prior Publication Data

US 2016/0141196 A1 May 19, 2016

(51) Int. Cl.
*H01L 21/683* (2006.01)
*H01L 23/00* (2006.01)
*H01L 21/67* (2006.01)

(52) U.S. Cl.
CPC ........ *H01L 24/75* (2013.01); *H01L 21/67144* (2013.01); *H01L 2224/7565* (2013.01)

(58) Field of Classification Search
CPC ............. H01L 24/75; H01L 2224/7565; H01L 21/67144
USPC ....................................................... 414/589
See application file for complete search history.

(56) References Cited

U.S. PATENT DOCUMENTS

| 5,579,985 | A  | * | 12/1996 | Ichikawa | ........... H05K 13/0408 228/102 |
| 7,918,638 | B1 | * | 4/2011  | Loggins  | .................. B60P 1/283 298/1 B |
| 8,496,426 | B2 | * | 7/2013  | Na       | ...................... G01R 31/2893 198/468.2 |
| 2002/0153735 | A1 | * | 10/2002 | Kress    | ................... B65G 47/918 294/87.1 |
| 2006/0131903 | A1 | * | 6/2006  | Bonora   | ............. H01L 21/68707 294/213 |
| 2008/0206960 | A1 | * | 8/2008  | Dang     | .................. G01R 31/2898 438/459 |
| 2010/0123268 | A1 | * | 5/2010  | Menard   | ............... H01L 21/6835 264/293 |
| 2013/0295721 | A1 | * | 11/2013 | Lyu      | ........................ H01L 21/50 438/108 |

* cited by examiner

*Primary Examiner* — Scott Lowe
(74) *Attorney, Agent, or Firm* — CKC & Partners Co., Ltd.

(57) ABSTRACT

A machine for transferring at least one micro-device includes a carrier and a transfer device. The carrier includes a pedestal, a substrate, and at least one first cushion layer. The substrate allows the micro-device to be temporarily disposed thereon. The first cushion layer is disposed between the pedestal and the substrate. The transfer device includes a transfer head holder, transfer head, and at least one second cushion layer. The transfer head holder moves at least along a z-axis substantially perpendicular to the substrate. The transfer head has a grip force on the micro-device. The second cushion layer is disposed between the transfer head holder and the transfer head.

20 Claims, 11 Drawing Sheets

MACHINE FOR TRANSFERRING MICRO-DEVICE

BACKGROUND

Technical Field

The present disclosure relates to machines for transferring micro-devices.

Description of Related Art

Integration and packaging issues are one of the main challenges for the commercialization of micro devices such as radio frequency (RF) microelectromechanical system (MEMS) microswitches, light-emitting diodes (LED) display systems, and MEMS or quartz-based oscillators.

Traditional technologies for transferring of micro-devices include a transfer process from a transfer wafer to a receiving wafer. The transfer process is performed through a transfer device having a transfer head, which has a grip force on the micro devices on the transfer wafer. However, in certain situation, the transfer head or the micro-devices may be arranged imperfectly, and the transfer head may produce an impact force on the micro-devices to damage the transfer head and the micro-devices.

SUMMARY

According to one embodiment of this invention, a machine for transferring at least one micro-device includes a carrier and a transfer device. The carrier includes a pedestal and a substrate. The substrate is disposed on the pedestal and allows the micro-device to be temporarily disposed thereon. The transfer device includes a transfer head holder, transfer head, and at least one cushion layer. The transfer head holder is capable of moving at least along a z-axis substantially perpendicular to the substrate. The transfer head is capable of having a grip force on the micro-device. The cushion layer is disposed between the transfer head holder and the transfer head.

According to another embodiment of this invention, a machine for transferring at least one micro-device includes a carrier and a transfer device. The carrier includes a pedestal, a substrate, and at least one cushion layer. The substrate allows the micro-device to be temporarily disposed thereon. The cushion layer is disposed between the pedestal and the substrate. The transfer device includes a transfer head holder and transfer head. The transfer head holder is capable of moving at least along a z-axis substantially perpendicular to the substrate. The transfer head is disposed on the transfer head holder and capable of having a grip force on the micro-device.

According to another embodiment of this invention, a machine for transferring at least one micro-device includes a carrier and a transfer device. The carrier includes a pedestal, a substrate, and at least one first cushion layer. The substrate allows the micro-device to be temporarily disposed thereon. The first cushion layer is disposed between the pedestal and the substrate. The transfer device includes a transfer head holder, transfer head, and at least one second cushion layer. The transfer head holder is capable of moving at least along a z-axis substantially perpendicular to the substrate. The transfer head is capable of having a grip force on the micro-device. The second cushion layer is disposed between the transfer head holder and the transfer head.

DETAILED DESCRIPTION

Reference will now be made in detail to the present embodiments of the invention, examples of which are illustrated in the accompanying drawings. Wherever possible, the same reference numbers are used in the drawings and the description to refer to the same or like parts.

Herein, the term "micro" device may refer to the descriptive size of certain devices in accordance. The term "micro" device is meant to refer to the scale of 1 micrometer to 1 millimeter. However, it is appreciated that the embodiments of the present invention are not necessarily so limited, and that certain aspects of the embodiments may be applicable to larger, and possibly small size scales.

It will be understood that when an element is referred to as being "on" another element, it can be directly on the other element or intervening elements may be present therebetween. In contrast, when an element is referred to as being "directly on" another element, there are no intervening elements present.

Figure 1:
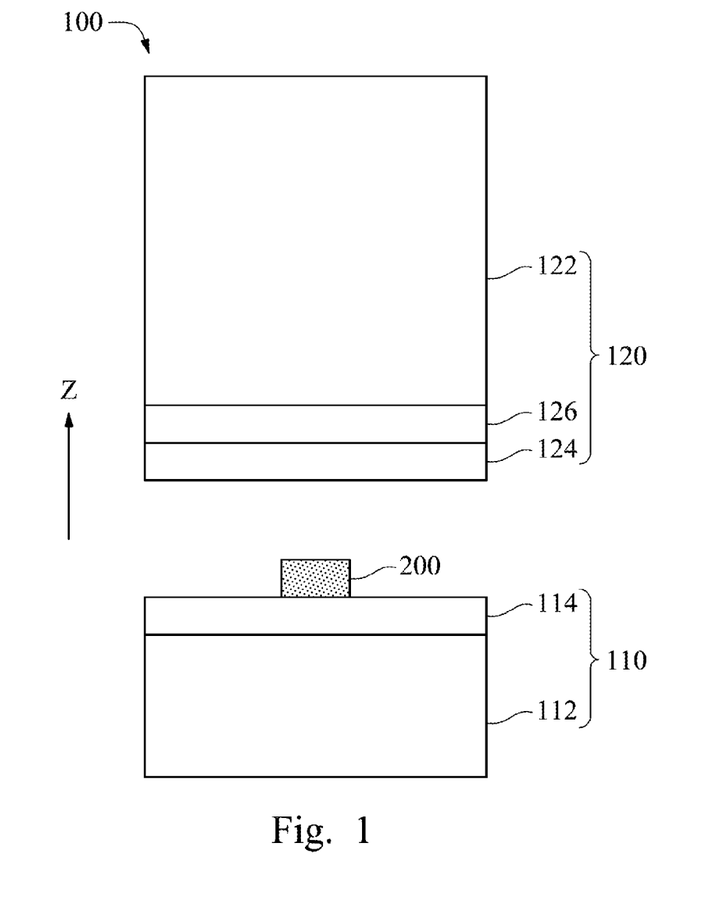
FIG. 1 is a side view of a machine for transferring at least one micro-device according to a first embodiment of this invention.

FIG. 1 is a side view of a machine 100 for transferring at least one micro-device 200 according to a first embodiment of this invention. The machine 100 includes a carrier 110 and a transfer device 120. The carrier 110 includes a pedestal 112 and a substrate 114. The substrate 114 is disposed on the pedestal 112 and allows the micro-device 200 to be temporarily disposed thereon. The transfer device 120 includes a transfer head holder 122, transfer head 124, and at least one cushion layer 126. The transfer head holder 122 is capable of moving at least along a z-axis substantially perpendicular to the substrate 114. The transfer head 124 is capable of having a grip force on the micro-device 200. The cushion layer 126 is disposed between the transfer head holder 122 and the transfer head 124.

In one or more embodiments of the invention, the transfer head 124 can operate in accordance with principles of electrostatic grippers, using such as but not limited to the attraction of opposite charges to pick up the micro-device 200. In some embodiments, an adhesive force between the transfer head 124 and micro-device 200 is designed to be greater than an adhesive force between the substrate 114 and the micro-device 200, so that the transfer head 124 can pick up the micro-device 200 by the adhesive force. In some embodiments, the transfer head 124 can operate with principles of vacuum grippers or mechanical grippers. It is noted that the transfer head 124 can be any element applicable to picking up the micro-device 200.

Figure 2:
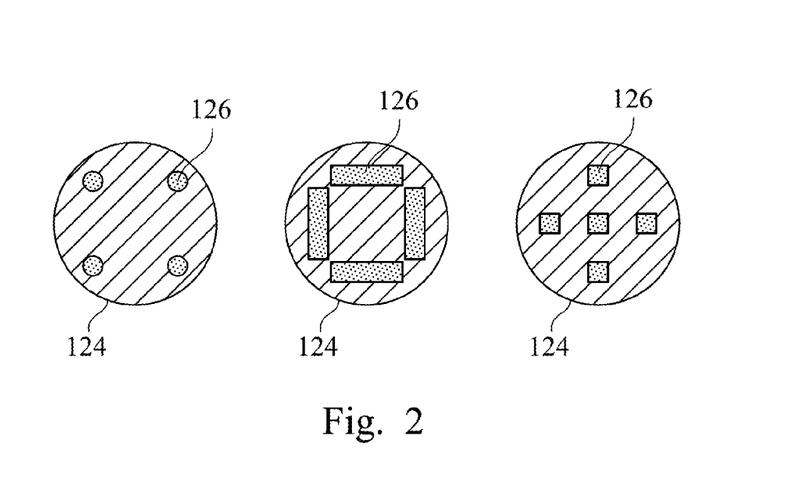
FIG. 2 is a series of exemplary top views of a cushion layer of the machine of FIG. 1.

FIG. 2 is a series of exemplary top views of the cushion layer 126 of the machine 100 of FIG. 1. The cushion layer 126 can be patterned or just flat without being patterned. Since the flat cushion layer has a larger area than the patterned cushion layer does, the force on the flat cushion layer produces less pressure than the force on the patterned cushion layer does. Therefore, the ability of the deformation of the patterned cushion layer can be better than the ability of the deformation of the flat cushion layer.

For enhancing the ability of deformation, the patterned cushion layer 126 can be point shaped, circular, rectangular, square, polygonal, or any combinations thereof. Although the patterned cushion layer 126 are depicted as only four or five blocks shown in the figure, the configuration of the cushion layer 126 is not limited. The number of the patterned cushion layers 126 can be in a range from about 2 to about 99. In one or more embodiments, plural cushion layers 126 are stacked together, and the cushion layers 126 can be made of different materials. The configuration of the patterned cushion layer 126 can be designed according to the practical conditions, such as the shape of the transfer head 124. In this embodiment, the shape of the transfer head 124 depicted in the figure is a circle, but it should not limit the scope of the present invention. The shape of the transfer head 124 can also be a square, a rectangle, a pentangle, a hexagon, a octagon, or other polygons.

Reference is now made back to FIG. 1. In the transfer process, when the transfer head 124 moves downwards along the z-axis to pick up the micro-device 200, the transfer head 124 pushes the micro-device 200, and the transfer head 124 is in contact with the micro-device 200. The contact of the micro-device 200 and the transfer head 124 may induce an impact force of the transfer head on the micro-device, and the impact force may damage the micro-device 200 and the transfer head 124. In this embodiment, since the cushion layer 126 can deform to absorb the impact force, the impact force can be reduced. Therefore, The micro-device 200 can be protected from being damaged.

In addition, under certain circumstances, the bottom surface of the transfer head 124 is not parallel with the top surface of the micro-device 200. That is, there may be a gap between the micro-device 200 and the transfer head 124 when the transfer head 124 is in contact with the micro-device 200. The gap is formed due to a variety of sources including, but not limited to, particulate contamination, warpage, misalignment of either surface of the transfer head 124 or the micro-device 200. Since the gap may change a distance between the transfer head 124 and the micro-device 200, the gap can decrease the grip force of the transfer head 124, such as electrostatic grippers, on the micro-device 200.

The cushion layer 126 can provide a cushion support to the transfer head 124. The cushion support can calibrate the transfer head 124 and eliminate the gap. That is, the bottom surface of the transfer head 124 can be calibrated to be parallel with the top surface of the micro-device 200 by the cushion support. As a result, the transfer head 124 can be level with the micro-device 200 when the transfer head 124 pushes the micro-device 200. The grip force of the transfer head 124 on the micro-device 200 can be maintained since the gap is eliminated.

The detail descriptions of the operation of the machine 100 are illustrated in accordance with the following FIGS. 6A-6E and FIGS. 7A-7C.

In addition to the ability of absorbing the impact force, the cushion layer 126 can also have an ability to withstand high temperatures. Ideally, the cushion layer 126 can be heat-resistant to the temperature ranging from about −40 to about 300 degrees on Celsius scale. During the transfer process, the transfer device 120 may be configured to release the micro-device 200 to another heated substrate. Heat energy may flow from the heated substrate through the transfer head 124 to the cushion layer 126. In a long-term use, the cushion layer 126 may be damaged by the heat energy. The configuration of the heat-resistant cushion layer 126 can prevent the damage of the heat energy.

Figure 3:
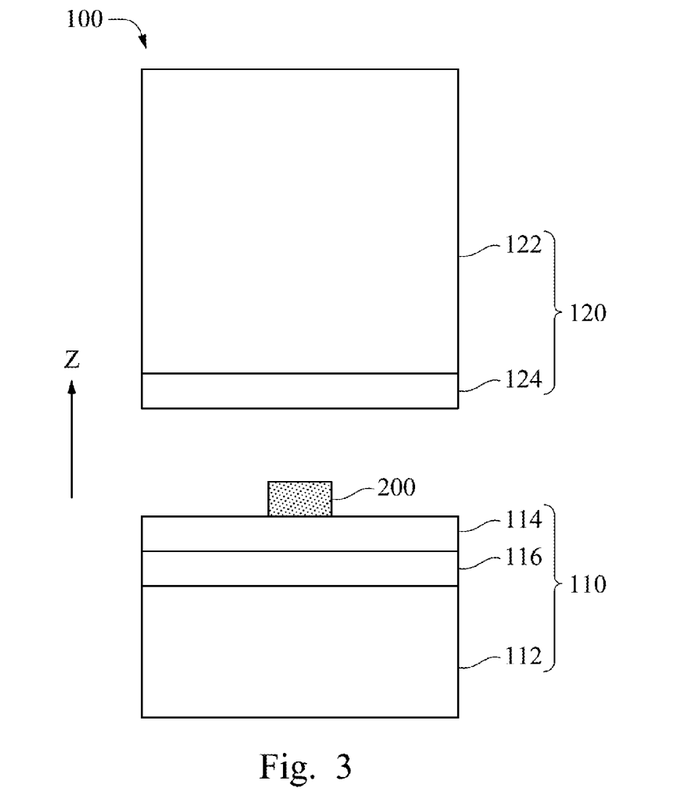
FIG. 3 is a side view of a machine for transferring at least one micro-device according to a second embodiment of this invention.

FIG. 3 is a side view of a machine 100 for transferring at least one micro-device 200 according to the second embodiment of this invention. The second embodiment is different from the first embodiment in the configuration of the cushion layer.

In the second embodiment, the machine 100 includes a carrier 110 and a transfer device 120. The carrier 110 includes a pedestal 112, a substrate 114, and at least one cushion layer 116. The substrate 114 allows the micro-device 200 to be temporarily disposed thereon. The cushion layer 116 is disposed between the pedestal 112 and the substrate 114 instead of between the transfer head holder 122 and transfer head 124 of the first embodiment. The transfer device 120 includes a transfer head holder 122 and a transfer head 124. The transfer head holder 122 is capable of moving at least along a z-axis substantially perpendicular to the substrate 114. The transfer head 124 is disposed on the transfer head holder 122 and capable of having a grip force on the micro-device 200.

Figure 4:
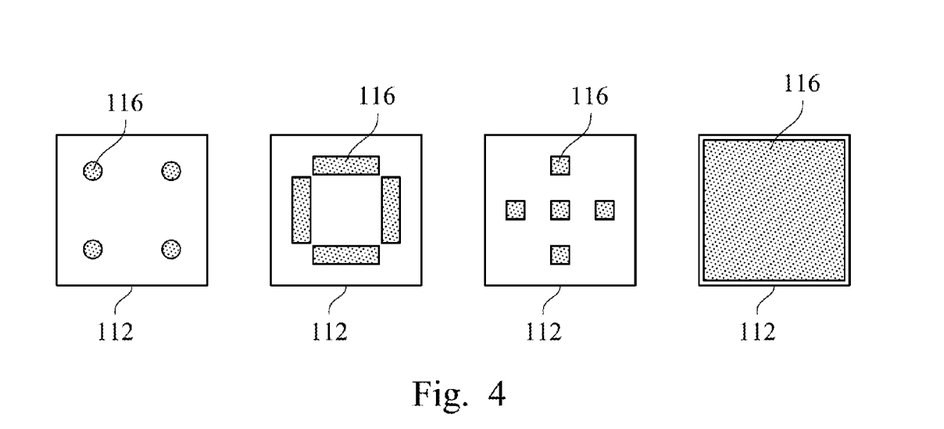
FIG. 4 is a series of exemplary top views of a cushion layer of the machine of FIG. 3.

FIG. 4 is a series of exemplary top views of a cushion layer 116 of the machine of FIG. 3. As mentioned in the first embodiment, the cushion layer 116 can be patterned or just flat without being patterned. Reference is now made to both FIG. 3 and FIG. 4. In this embodiment, since the cushion layer 116 bears the weight of both the micro-device 200 and the substrate 114, the cushion layer 116 is easier to deform than the cushion layer 126 of the first embodiment does, and therefore, in this embodiment, the cushion layer 116 can be flat to bear the weight.

The configuration of the patterned cushion layer 116 can be designed according to the practical conditions, such as the shape of the substrate 114. In some embodiments, a shape of the substrate 114 depicted in the figure is a square, but it should not limit the scope of the present invention. The shape of the substrate 114 can also be a circle, a rectangle, a pentangle, a hexagon, a octagon, or other polygons. The patterned cushion layer 116 can be point shaped, circular, rectangular, square, polygonal, or any combinations thereof, and the patterned cushion layer 116 fits the configuration of the substrate 114. In one or more embodiments, plural cushion layers 116 are stacked together, and the cushion layers 116 can be made of different materials.

As mentioned in the first embodiment, the cushion layer 116 can be made of various materials, such as silicone, Poly(methyl methacrylate) (PMMA), rubber, a foamed polymer, Poly(vinyl chloride) (PVC), an adhesive organic material, a flexible material, or any combinations thereof. It is noted that, in the second embodiment, since the carrier 110 does not approach and touch heated devices, the materials of the cushion layer 116 are not limited to be heat-resistant.

Reference is now made back to FIG. 3. In the transfer process, when the transfer head 124 is in contact with the micro-device 200, the impact force exerted by the transfer head 124 on the micro-device 200 can induced a reacting force. The reacting force is exerted by the substrate 114 on the micro-device 200. In this embodiment, the cushion layer 116 can deform to absorb the reacting force, and therefore protect the micro-device 200 from being damaged.

Also, under certain circumstances, the top surface of the micro-device 200 is not parallel with the bottom surface of the transfer head 124. That is, there may be a gap between the micro-device 200 and the transfer head 124 when the transfer head 124 is in contact with the micro-device 200. The cushion layer 116 can provide a cushion support to the substrate 114 when the transfer head 124 pushes the micro-device 200. The cushion support can adjust the micro-device 200 and the substrate 114, and therefore eliminate the gap. As a result, the micro-device 200 on the substrate 114 can be level with the transfer head 124. That is, the top surface of the micro-device 200 can be calibrated to be parallel with the bottom surface of the transfer head 124. The grip force of the transfer head 124 on the micro-device 200 can be maintained since the gap is eliminated. The detail descriptions of the operation of the machine 100 are illustrated in accordance with the following FIGS. 6A-6E and FIGS. 7A-7C.

Figure 5:
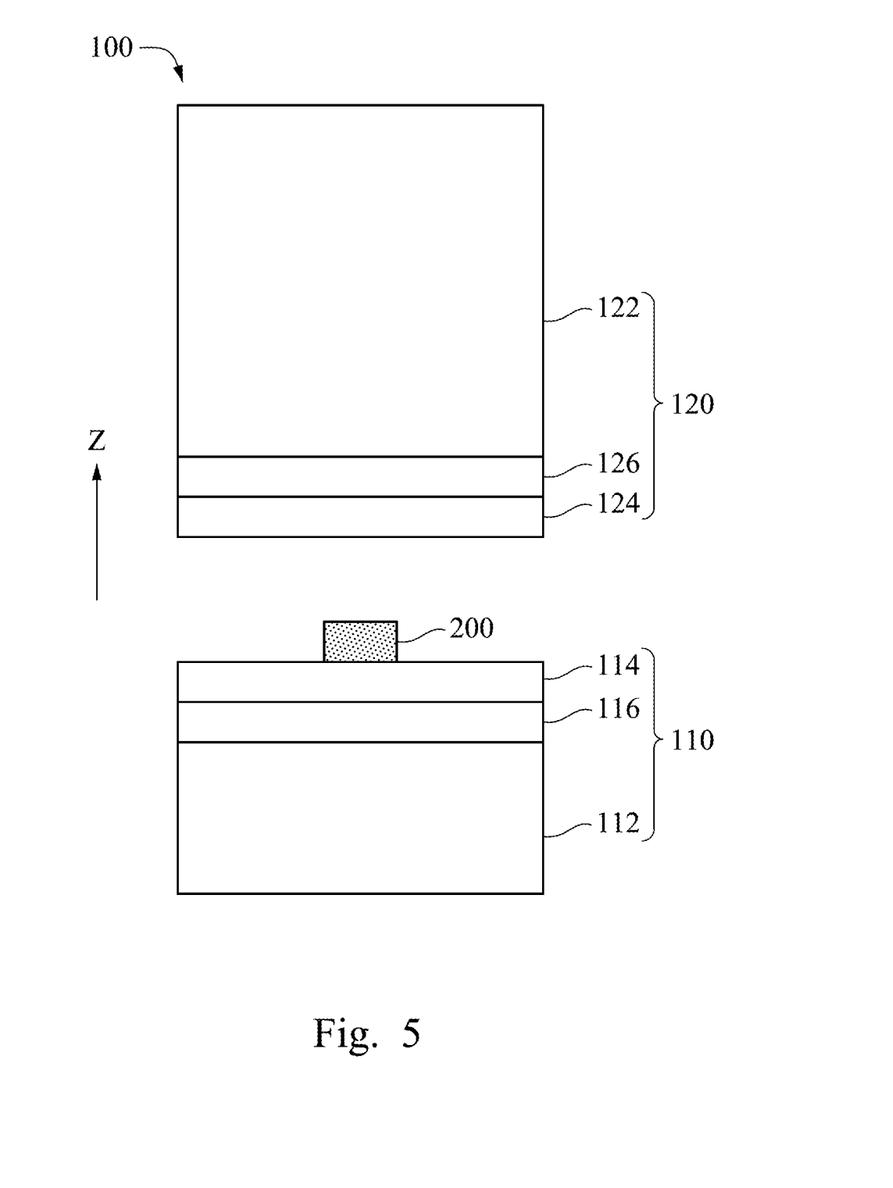
FIG. 5 is a side view of a machine for transferring at least one micro-device according to a third embodiment of this invention.

FIG. 5 is a side view of a machine 100 for transferring at least one micro-device 200 according to the third embodiment of this invention. The third embodiment is different from the previous embodiments in the configuration of the cushion layer.

In the third embodiment, a machine 100 for transferring at least one micro-device 200 includes a carrier 110 and a transfer device 120. The carrier 110 includes a pedestal 112, a substrate 114, and at least one first cushion layer 116. The substrate 114 allows the micro-device 200 to be temporarily disposed thereon. The first cushion layer 116 is disposed between the pedestal 112 and the substrate 114. The transfer device 120 includes a transfer head holder 122, the transfer head 124, and at least one second cushion layer 126. The transfer head holder 122 is capable of moving at least along a z-axis substantially perpendicular to the substrate 114. The transfer head 124 is capable of having a grip force on the micro-device 200. The second cushion layer 126 is disposed between the transfer head holder 122 and the transfer head 124.

As mentioned in the previous embodiments, the first cushion layer 116 and the second cushion layer 126 can be made of various materials. The configurations of the first cushion layer 116 and the second cushion layer 126 are not repeated herein.

Figure 6A:
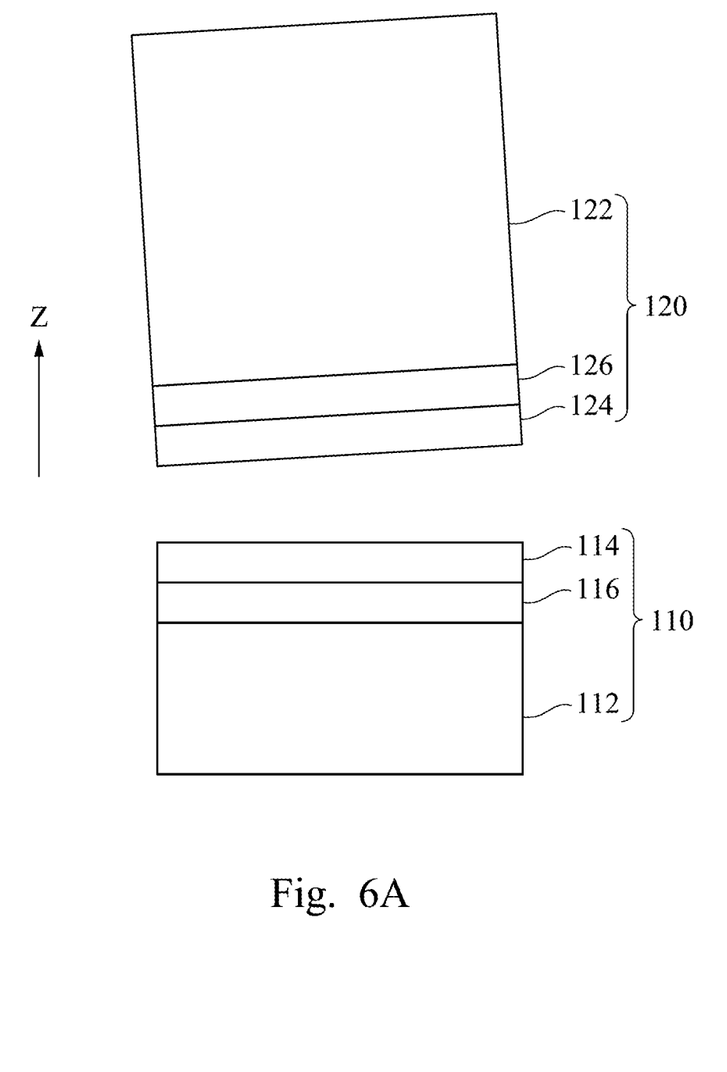
FIGS. 6A-6E are schematic views of plural steps of an operation of the machine of FIG. 5.

FIGS. 6A-6E are schematic views of plural steps of an operation of the machine 100 of FIG. 5. Referring to FIG. 6A, the machine 100 of the third embodiment is provided. The carrier 110 and the transfer device 120 may not be aligned well. For better illustration, it is depicted that the bottom surface of the transfer head 124 of the transfer device 120 is not level with the substrate 114 of the carrier 110.

Figure 6B:
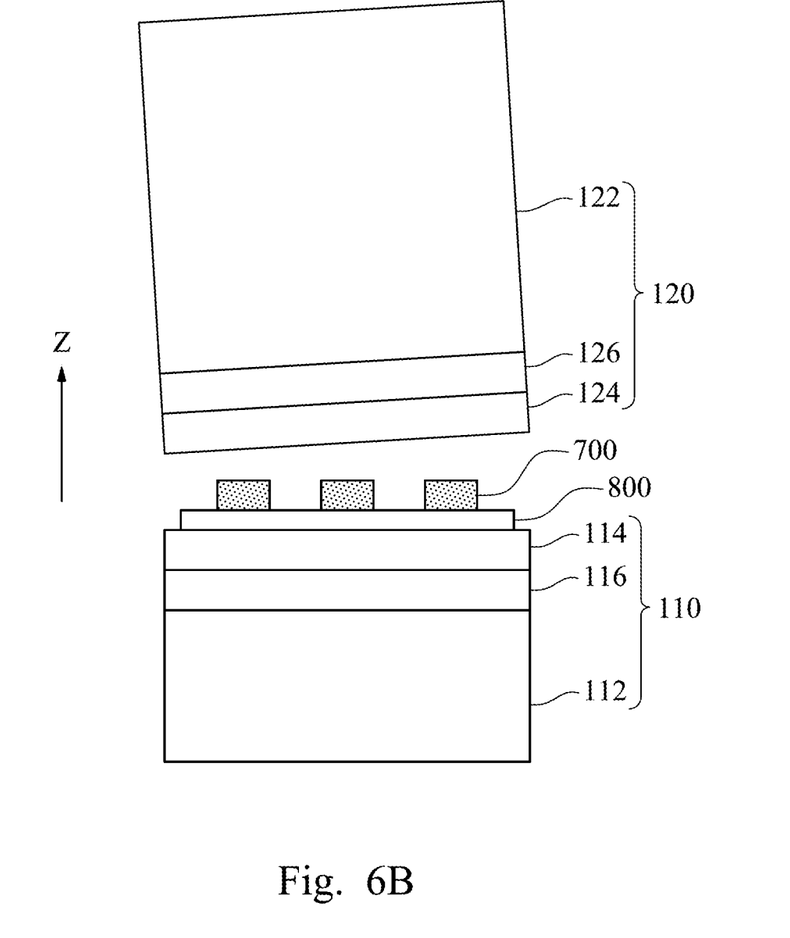

Referring to FIG. 6B, plural micro-devices 700 are disposed on and attached to the substrate 114 through an adhesive 800 for temporary bonding. The adhesive 800 can be formed from a material that can maintain the micro-devices 700 on the substrate 114 during certain processes and operations. The adhesive 800 can be made of epoxy, poly(methyl methacrylate) (PMMA), polysiloxanes, or any combinations thereof. In this embodiment, the adhesive 800 can be deformable.

Figure 6C:
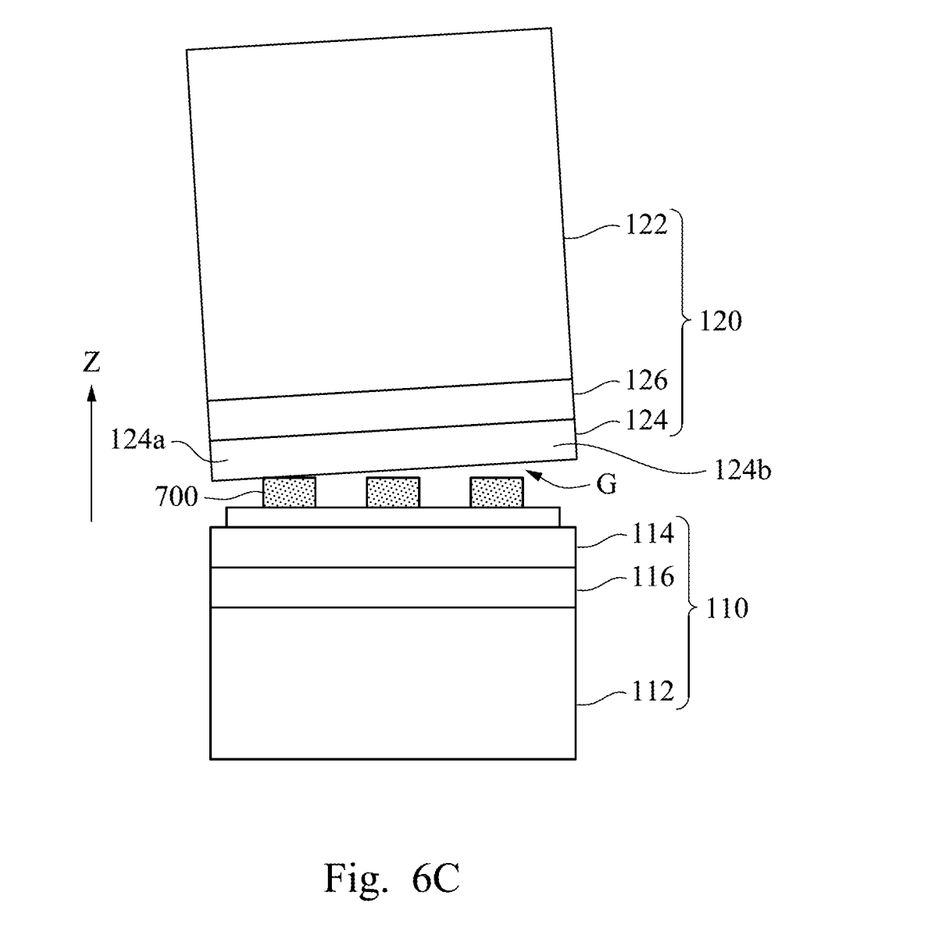

Referring to FIG. 6C, the transfer head holder 122 moves downwards along the z-axis. On one hand, the transfer head 124 has an impact force on the micro-devices 700 when the transfer head 124 is in contact with the micro-devices 700. The impact force can also induce a reacting force of the substrate 114 on the micro-devices 700. One the other hand, Due to the misalignment of the surfaces the carrier 110 and the transfer device 120, one side 124a of the transfer head 124 touches the micro-devices 700, but the other side 124b of the transfer head 124 is hard to touch the micro-devices 700. That is, there is a gap G between the other side 124b of the transfer head 124 and the micro-devices 700 when the transfer head 124 is in contact with the micro-devices 700. As mentioned previously, the gap G may decrease the grip force of the transfer head 124.

Figure 6D:
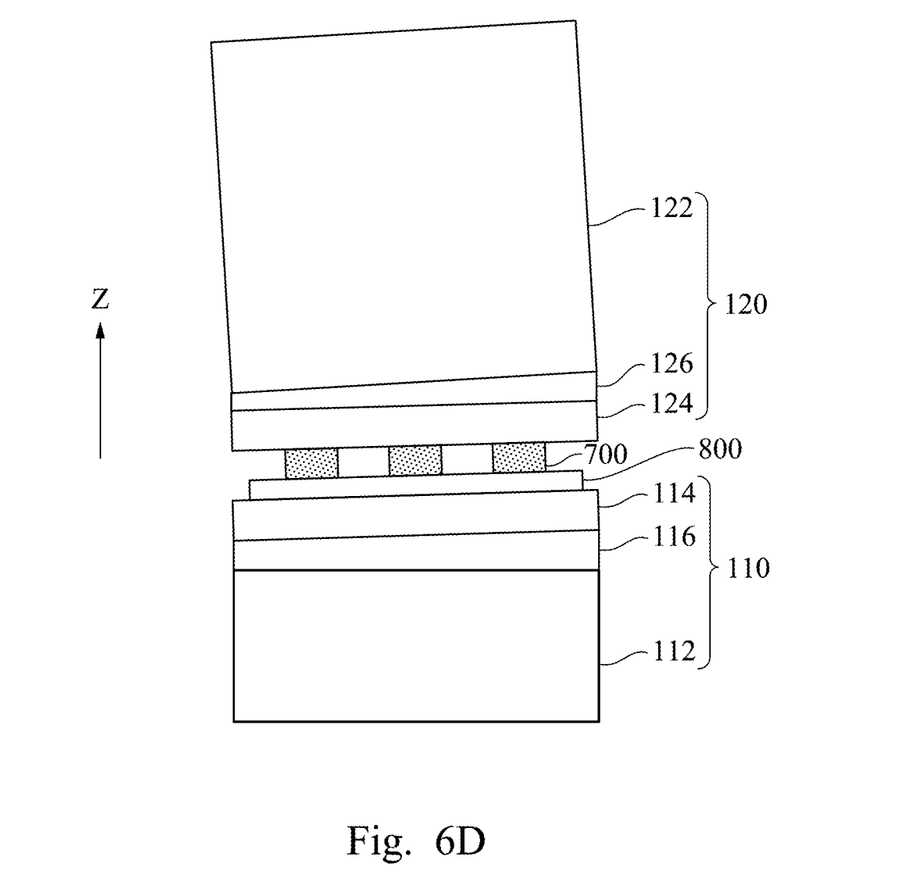

Referring to FIG. 6D, in this embodiment, the first cushion layer 116 and the second cushion layer 126 deform to absorb the impact force and the reacting force when the micro-devices 700 are in contact with the transfer head 124. The impact force and the reacting force can be reduced to avoid the damage of the transfer head 124 and the micro-devices 700.

Furthermore, the first cushion layer 116 and the second cushion layer 126 are depicted as trapezoids to indicate that the thickness of the first cushion layer 116 and the second cushion layer 126 can be uneven due to the deformation. The first cushion layer 116 and the second cushion layer 126 with the uneven thickness can cooperate to make the micro-devices 700 level with the transfer head 124 when the transfer head 124 pushes the micro-devices 700, and hence the gap G between the micro-devices 700 and the transfer head 124 is eliminated. Therefore, the grip force of the transfer head 124 on the micro-devices 700 can be maintained.

Figure 6E:
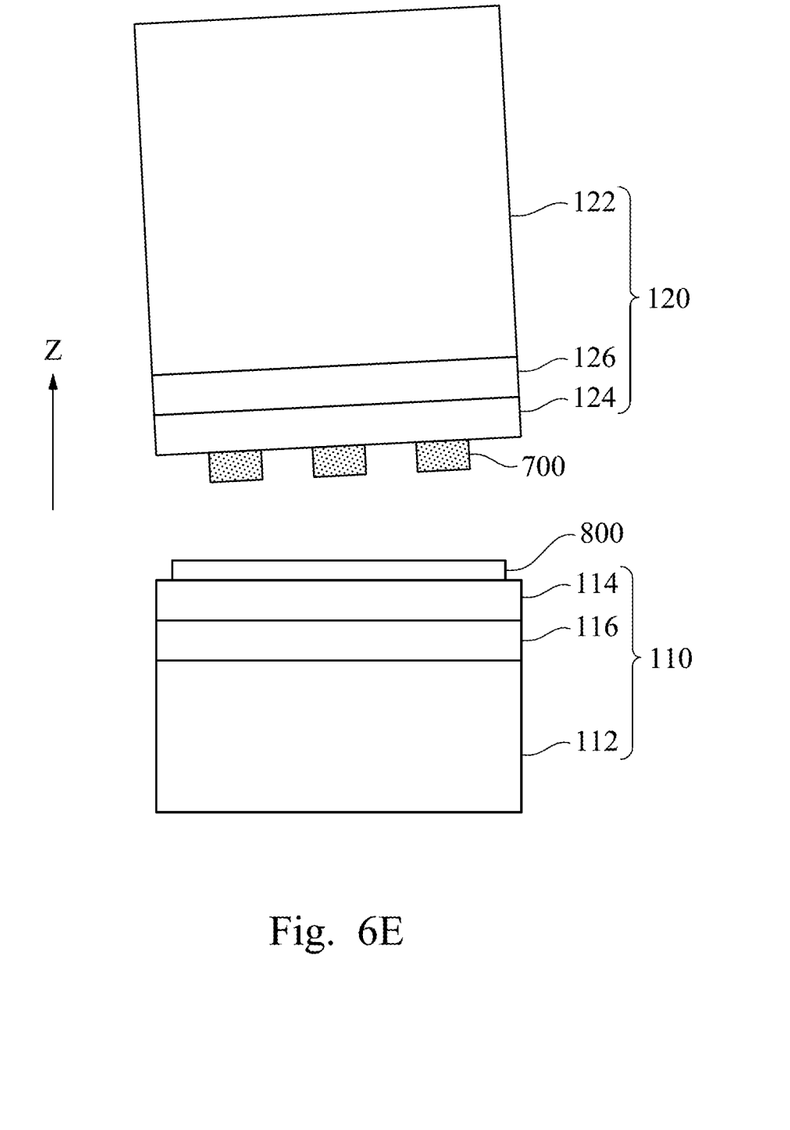

Referring to FIG. 6E, since the transfer head 124 has the grip force on the micro-devices 700, when the transfer head holder 122 moves upwards along the z-axis, the micro-devices 700 are gripped by the transfer device 120 and leave the carrier 110. To be specific, the micro-devices 700 can leave the adhesive 800. Then, the transfer device 120 can move to another substrate to release the gripped micro-devices 700.

Figure 7A:
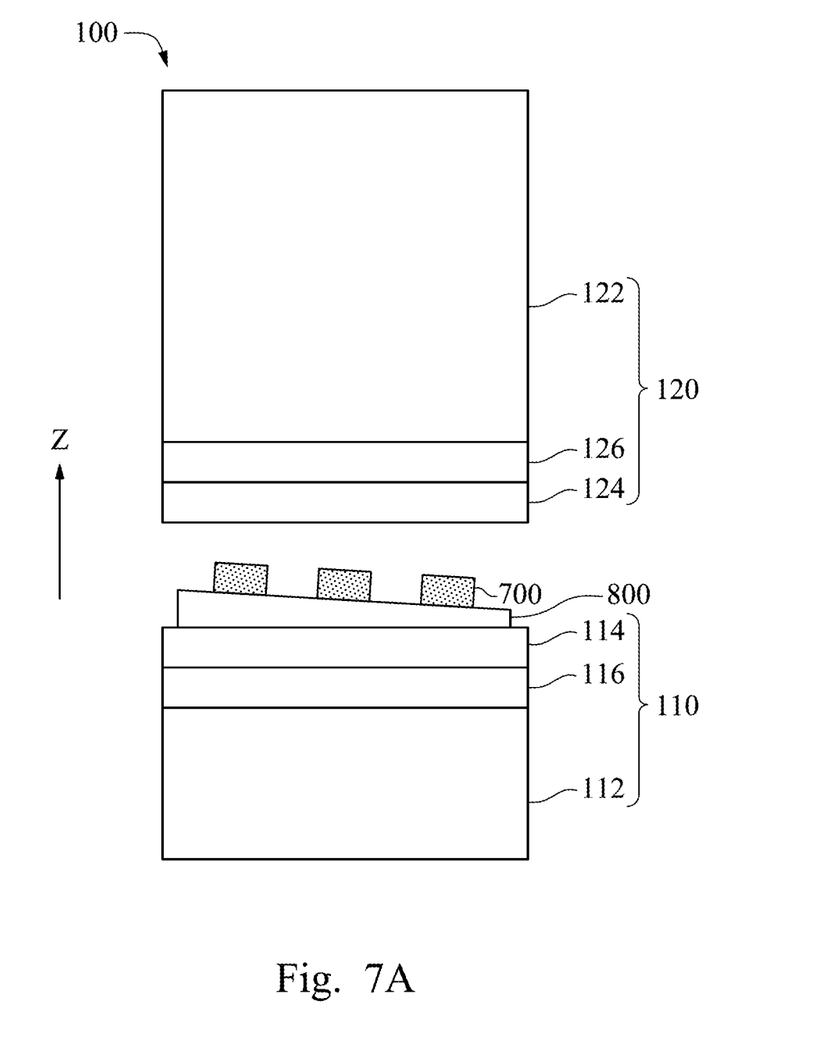
FIGS. 7A-7C are schematic views of plural steps of another operation of the machine of FIG. 5.
Figure 7B:
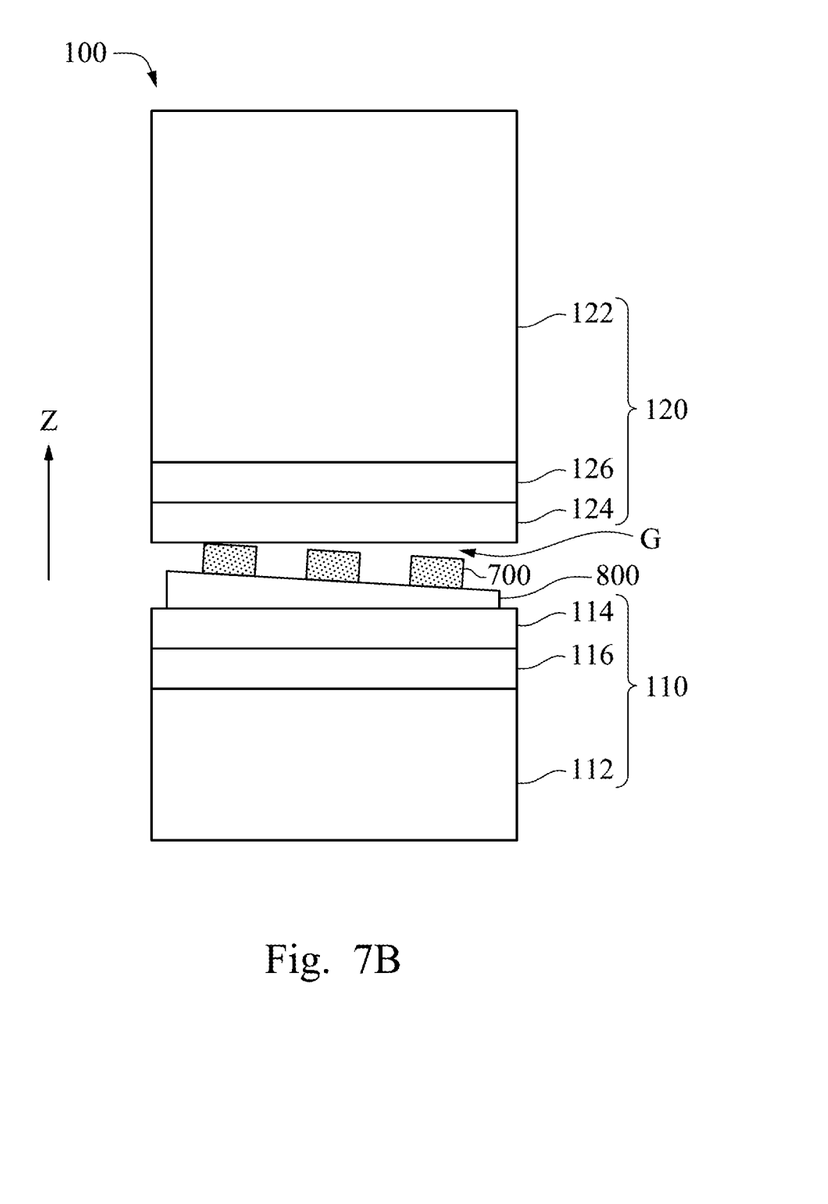
Figure 7C:
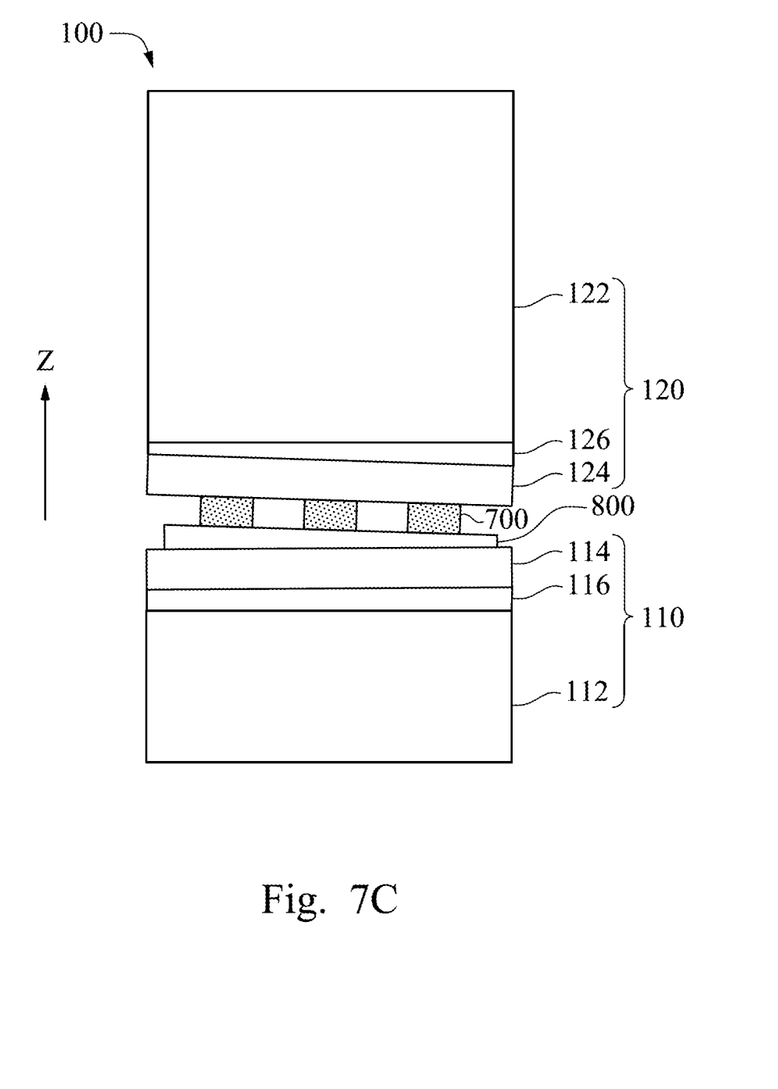

FIGS. 7A-7C are schematic views of plural steps of another operation of the machine 100 of FIG. 5. Referring to FIG. 7A, the machine 100 of the third embodiment is provided. In this embodiment, the carrier 110 and the transfer device 120 are aligned well. However, due to the defects of the adhesive 800 for temporary bonding, such as the problem of uneven thickness of the adhesive 800, plural micro-devices 700 are attached to the substrate 114 through the adhesive 800 imperfectly. As indicated in the figures, the top surfaces of the micro-devices 700 are not flush with each other.

Referring to FIG. 7B, as mentioned previously, the transfer head holder 122 moves downwards along the z-axis. There are an impact force exerted by the transfer head 124 on the micro-devices 700 and a reacting force exerted by the substrate 114 on the micro-devices 700 when the transfer head 124 is in contact with the micro-devices 700. The impact force and the reacting force may damage the micro-devices 700. In addition, since the top surfaces of the micro-devices 700 are not flush with each other, there is a gap G between a portion of the micro-devices 700 and the transfer head 124 when the transfer head 124 is in contact with the micro-devices 700. The gap G may decrease the grip force of the transfer head 124.

Referring to FIG. 7C, the first cushion layer 116 and second cushion layer 126 can deform to absorb the impact force, and the transfer head 124 and the micro-devices 700 are prevented from being damaged. In addition, the first cushion layer 116 and the second cushion 126 can also deform to make the micro-devices 700 level with the transfer head 124 so as to eliminate the gap G between the micro-devices 700 and the transfer head 124. Also, the adhesive 800 may also deform to help to make the micro-devices 700 level with the transfer head 124. Therefore, the grip force of the transfer head 124 on the micro-device 200 can be maintained.

The embodiments of the present invention provide the machines for transferring micro-devices. The machines are configured with at least one cushion layer, which can deform to absorb the impact force on the micro-device and eliminate the gap between the transfer head and the micro-devices. As a result, the micro-devices can be prevented from being damaged, and the grip force of the transfer head can be maintained.

Although the present invention has been described in considerable detail with reference to certain embodiments thereof, other embodiments are possible. Therefore, the spirit and scope of the appended claims should not be limited to the description of the embodiments contained herein.

It will be apparent to those skilled in the art that various modifications and variations can be made to the structure of the present invention without departing from the scope or spirit of the invention. In view of the foregoing, it is intended that the present invention cover modifications and variations of this invention provided they fall within the scope of the following claims.

What is claimed is:

1. A machine for transferring at least one micro-device, the machine comprising:
   a carrier comprising:
   a pedestal; and
   a substrate disposed on the pedestal for allowing the micro-device to be temporarily disposed thereon; and
   a transfer device comprising:
   a transfer head holder capable of moving at least along a z-axis substantially perpendicular to the substrate;
   a transfer head having a gripping region capable of having a grip force on the micro-device; and
   at least one cushion layer disposed between the transfer head holder and the transfer head, wherein a vertical projection of the cushion layer on a bottom surface of the transfer head covers the gripping region, and an ability of deformation of the cushion layer is greater than an ability of deformation of the transfer head.

2. The machine of claim 1, wherein a plurality of the cushion layers are stacked together.

3. The machine of claim 1, wherein the cushion layer is flat without being patterned.

4. The machine of claim 1, wherein the cushion layer is patterned.

5. The machine of claim 4, wherein the patterned cushion layer is point shaped, circular, rectangular, square, polygonal, or any combinations thereof.

6. The machine of claim 4, wherein the number of the patterned cushion layers is in a range from about 2 to about 99.

7. The machine of claim 1, wherein the cushion layer is made of silicone, Poly(methyl methacrylate) (PMMA), rubber, a foamed polymer, Poly(vinyl chloride) (PVC), an adhesive organic material, a flexible material, or any combinations thereof.

8. The machine of claim 1, wherein the cushion layer deforms to absorb an impact force of the transfer head on the micro-device when the transfer head is in contact with the micro-device.

9. The machine of claim 1, wherein the cushion layer provides a cushion support to the transfer head, such that the transfer head is level with the micro-device when the transfer head pushes the micro-device.

10. A machine for transferring at least one micro-device, the machine comprising:
    a carrier comprising:
    a pedestal;
    a substrate having a carrying region for allowing the micro-device to be temporarily disposed thereon; and
    at least one cushion layer disposed between the pedestal and the substrate, wherein a vertical projection of the cushion layer on a top surface of the substrate covers the carrying region, and an ability of deformation of the cushion layer is greater than an ability of deformation of the substrate; and
    a transfer device comprising:
    a transfer head holder capable of moving at least along a z-axis substantially perpendicular to the substrate; and
    a transfer head disposed on the transfer head holder and capable of having a grip force on the micro-device.

11. The machine of claim 10, wherein the cushion layer is flat without being patterned.

12. The machine of claim 11, wherein the cushion layer provides a cushion support to the substrate, such that the micro-device on the substrate is level with the transfer head when the transfer head pushes the micro-device.

13. The machine of claim 10, wherein the cushion layer is patterned.

14. The machine of claim 13, wherein the patterned cushion layer is point shaped, circular, rectangular, square, polygonal, or any combinations thereof.

15. The machine of claim 13, wherein the number of the patterned cushion layers is in a range from about 2 to about 99.

16. The machine of claim 10, wherein a plurality of the cushion layers are stacked together.

17. The machine of claim 10, wherein the cushion layer is made of silicone, Poly(methyl methacrylate) (PMMA), rubber, a foamed polymer, Poly(vinyl chloride) (PVC), an adhesive organic material, a flexible material, or any combinations thereof.

18. The machine of claim 10, wherein the cushion layer deforms to absorb a reacting force of the substrate on the micro-device when the transfer head is in contact with the micro-device.

19. A machine for transferring at least one micro-device, the machine comprising:
    a carrier comprising:
    a pedestal;
    a substrate for allowing the micro-device to be temporarily disposed thereon; and
    at least one first cushion layer disposed between the pedestal and the substrate; and
    a transfer device comprising:
    a transfer head holder capable of moving at least along a z-axis substantially perpendicular to the substrate;
    a transfer head having a gripping region capable of having a grip force on the micro-device; and
    at least one second cushion layer disposed between the transfer head holder and the transfer head, wherein a vertical projection of the second cushion layer on a bottom surface of the transfer head covers the gripping region, and an ability of deformation of the second cushion layer is greater than an ability of deformation of the transfer head.

20. The machine of claim 19, wherein the first cushion layer and the second cushion layer cooperate to make the micro-device level with the transfer head when the transfer head pushes the micro-device.

* * * * *